(12) United States Patent
Shin et al.

(10) Patent No.: US 7,761,763 B2
(45) Date of Patent: Jul. 20, 2010

(54) SYSTEM-ON-CHIP (SOC) HAVING BUILT-IN-SELF-TEST CIRCUITS AND A SELF-TEST METHOD OF THE SOC

(75) Inventors: Jong-Chul Shin, Suwon-si (KR); Jong-Ho Kim, Seoul (KR); Hae-Young Rha, Seoul (KR); Kee-Won Joe, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 22 days.

(21) Appl. No.: 12/182,785

(22) Filed: Jul. 30, 2008

(65) Prior Publication Data

US 2008/0313515 A1   Dec. 18, 2008

Related U.S. Application Data

(62) Division of application No. 11/066,585, filed on Feb. 25, 2005, now Pat. No. 7,421,635.

(30) Foreign Application Priority Data

Feb. 26, 2004   (KR) ............................... 2004-12991

(51) Int. Cl.
  *G01R 31/28* (2006.01)
(52) U.S. Cl. ..................... 714/733; 714/732; 714/738
(58) Field of Classification Search ................. 714/733, 714/734
  See application file for complete search history.

(56) References Cited

U.S. PATENT DOCUMENTS

| 5,416,784 | A | * | 5/1995 | Johnson ..................... 714/733 |
| 5,557,619 | A | | 9/1996 | Rapoport |
| 5,675,545 | A | | 10/1997 | Madhavan et al. |
| 5,961,653 | A | | 10/1999 | Kalter et al. |

(Continued)

FOREIGN PATENT DOCUMENTS

JP   10-162600   6/1998

(Continued)

OTHER PUBLICATIONS

A. Benso, et al., "An On-Line Bisted SRAM IP Core" ITC International Test Conference, Paper 372, pp. 993-1000.

*Primary Examiner*—Kevin L Ellis
*Assistant Examiner*—Steve Nguyen
(74) *Attorney, Agent, or Firm*—F. Chau & Associates, LLC

(57) ABSTRACT

A system-on-chip (SOC) having built-in-self-test (BIST) circuits and a self-test method of the SOC are provided. The SOC having the BIST circuits includes intellectual property (IP) blocks having BIST logic circuits and a BIST control unit. The BIST logic circuit operates in a normal or a test mode in response to control data received through a system bus, and outputs test result data in the test mode. The BIST control unit tests the IP blocks by transferring the control data, a command signal, test pattern data, and test address signals to the BIST logic circuit through the system bus, and compresses and stores the test result data received through the system bus in the test mode.

4 Claims, 9 Drawing Sheets

U.S. PATENT DOCUMENTS

| | | |
|---|---|---|
| 6,374,370 B1 | 4/2002 | Bockhaus et al. |
| 6,510,534 B1 * | 1/2003 | Nadeau-Dostie et al. .... 714/724 |
| 6,654,920 B1 * | 11/2003 | Hetherington et al. ...... 714/733 |
| 6,681,357 B2 | 1/2004 | Pendurkar |
| 7,146,550 B2 * | 12/2006 | Nagata ....................... 714/726 |
| 7,366,650 B2 * | 4/2008 | Nightingale et al. .......... 703/26 |
| 2004/0006729 A1 | 1/2004 | Pendurkar |

FOREIGN PATENT DOCUMENTS

| | | |
|---|---|---|
| KR | 000033120 A | 6/2000 |
| KR | 1020020017771 A | 3/2002 |
| KR | 2003-92094 | 6/2005 |
| WO | 02/095586 A2 | 11/2002 |

* cited by examiner

SYSTEM-ON-CHIP (SOC) HAVING BUILT-IN-SELF-TEST CIRCUITS AND A SELF-TEST METHOD OF THE SOC

CROSS-REFERENCE TO RELATED APPLICATION

This is a divisional application of U.S. application Ser. No. 11/066,585, filed Feb. 25, 2005 now U.S. Pat. No. 7,421,635 and which claims foreign priority under 35 U.S.C. §119 to Korean Patent Application No. 2004-12991 filed Feb. 26, 2004, respectively, which are hereby incorporated by reference for all purposes as if fully set forth herein.

FIELD OF THE INVENTION

The present invention relates to a system-on-chip (SOC), and more particularly, to a SOC having built-in self-test circuits and a self-test method of the SOC.

DESCRIPTION OF THE RELATED ART

Generally, a scan test method employed by automatic test equipment (ATE) is used to test the operating characteristics of a system-on-chip (SOC). An example of a conventional ATE is disclosed in U.S. Pat. No. 4,763,066. The ATE tests the SOC for defects by applying a stimulus signal to the SOC and examining a response signal of the SOC to the stimulus signal. The final result of such a test is "pass" if the response signal of the SOC is within an acceptable error range, and "fail" if the response signal is outside the acceptable error range.

FIG. 1 is a block diagram of a conventional SOC 10 and ATE 20. Referring to FIG. 1, the SOC 10 includes intellectual property (IP) blocks 50 through 80 that are connected to a system bus 40. The ATE 20 is connected to a pad 30 of the SOC 10, and tests the SOC 10 by sequentially applying a stimulus signal to each of the IP blocks 50 through 80 through the system bus 40. Here, each of the IP blocks 50 through 80 includes a test signal pass for a scan test used by the ATE 20.

FIG. 2 is a view of an inner structure of the IP block 50 included in the SOC 10 of FIG. 1. Referring to FIG. 2, the IP block 50 includes combinational circuits 51 through 53, multiplexers 54 through 56, and storage cells 57 through 59. Although not shown, the IP block 50 further includes additional combinational circuits and storage cells. The multiplexers 54 through 56 are supplementary circuits used to scan test the IP block 50, and the multiplexers 54 through 56 and the storage cells 57 through 59 form a scan chain (i.e., the test signal pass). In other words, the multiplexers 54 through 56 connecting the combinational circuits 51 through 53 and the storage cells 57 through 59 within the IP block 50 form the test signal pass.

When the SOC 10 is being tested, a test control signal SCAN_EN and a test signal SCAN_DATA are inputted to the IP block 50. When the test control signal SCAN_EN is enabled, the test signal SCAN_DATA is sequentially transferred along the scan chain formed by the multiplexers 54 through 56 and storage cells 57 through 59. In other words, the test signal SCAN_DATA is transferred in the order of the multiplexer 54, the storage cell 57, the multiplexer 55, the storage cell 58, the multiplexer 56, and the storage cell 59. Thus, scan test times using the conventional ATE 20 are long because the test signal SCAN_DATA must pass through all the elements of the scan chain In addition, the scan test method using the conventional ATE has a weakness in detecting a fault related to the operating time of the SOC 10 because it has difficulties testing at the speed which the SOC 10 operates. Furthermore, the scan test method using the ATE 20 can only be used before the SOC 10 is adopted in a particular system and installed on a circuit board.

SUMMARY OF THE INVENTION

The present invention provides a system-on-chip (SOC) with a built-in-self-test circuit and a self-test method of the SOC that can perform a test at an operating speed of the SOC, shorten the test time, and perform the test after the SOC is installed on a circuit board.

According to an aspect of the present invention, there is provided an SOC with built-in-self-test circuits, the SOC including intellectual property (IP) blocks each having a built-in-self-test (BIST) logic circuit and a BIST control unit. The BIST logic circuit operates in a normal or a test mode in response to control data received through a system bus, and outputs test result data in a test mode. The BIST control unit tests the IP blocks by transferring the control data, a command signal, test pattern data, and test address signals to the BIST logic circuit through the system bus, and compresses and stores the test result data received through the system bus in a test mode.

According to another aspect of the present invention, there is provided a self-test method of a SOC with built-in-self-test circuits, the method including: a BIST control unit for sequentially inputting test pattern data to a first combinational circuit through a BIST logic circuit; simultaneously storing test result data outputted from a second combinational circuit in storage cells within the BIST logic circuit; sequentially reading the test result data stored in the storage cells; and compressing and storing the read test result data.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
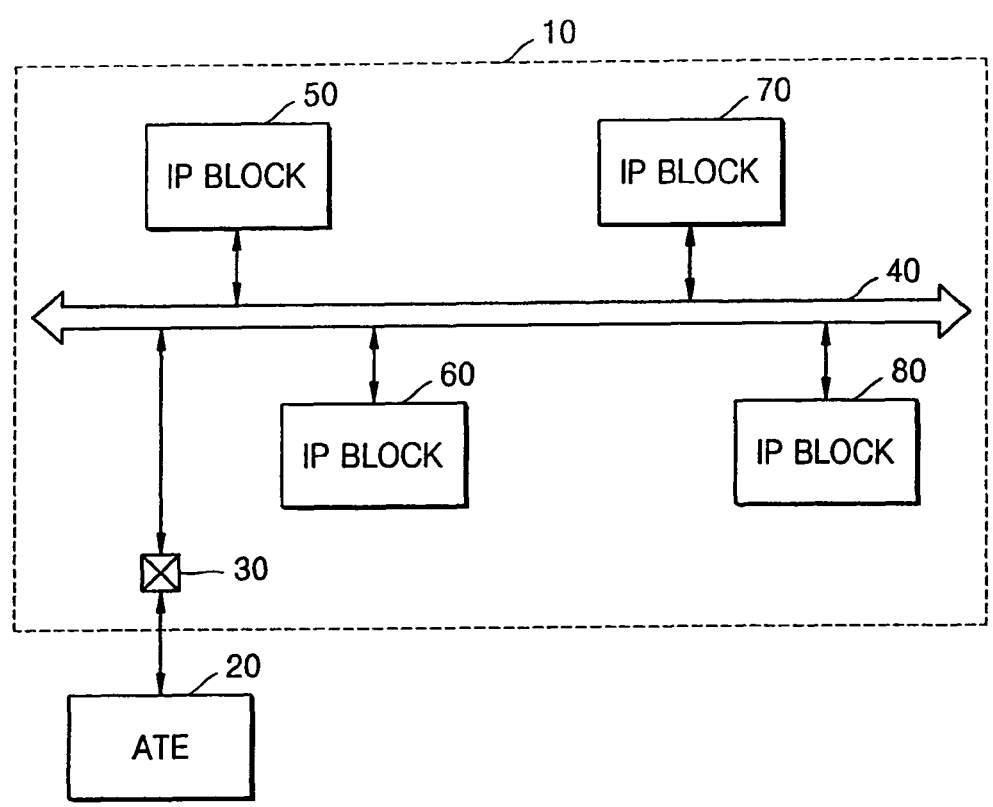
FIG. 1 is a block diagram of a conventional system-on-chip (SOC) and automatic test equipment (ATE)
Figure 2:
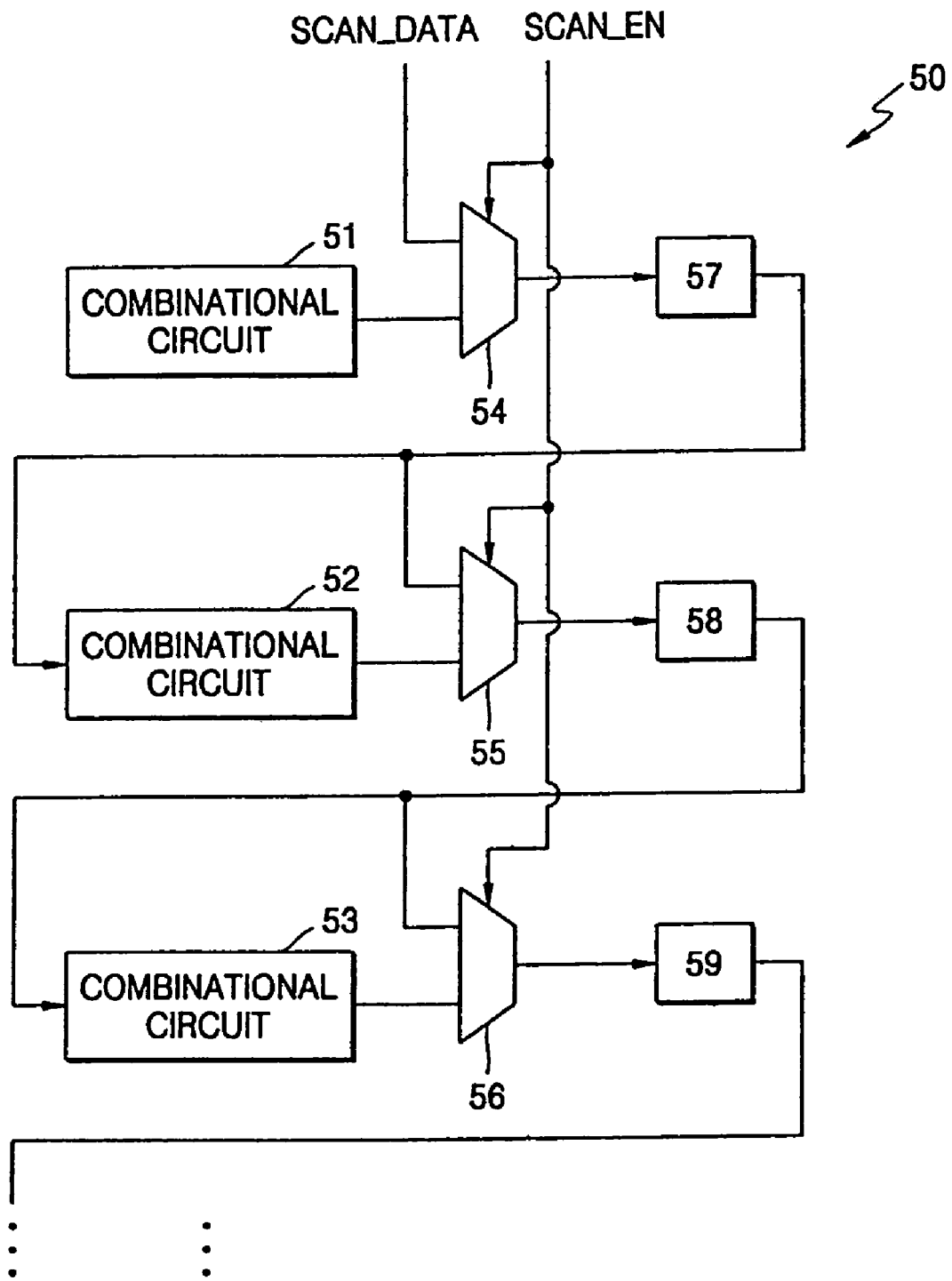
FIG. 2 is a view of an inner structure of an intellectual property (IP) block included in the SOC of FIG. 1.
Figure 3:
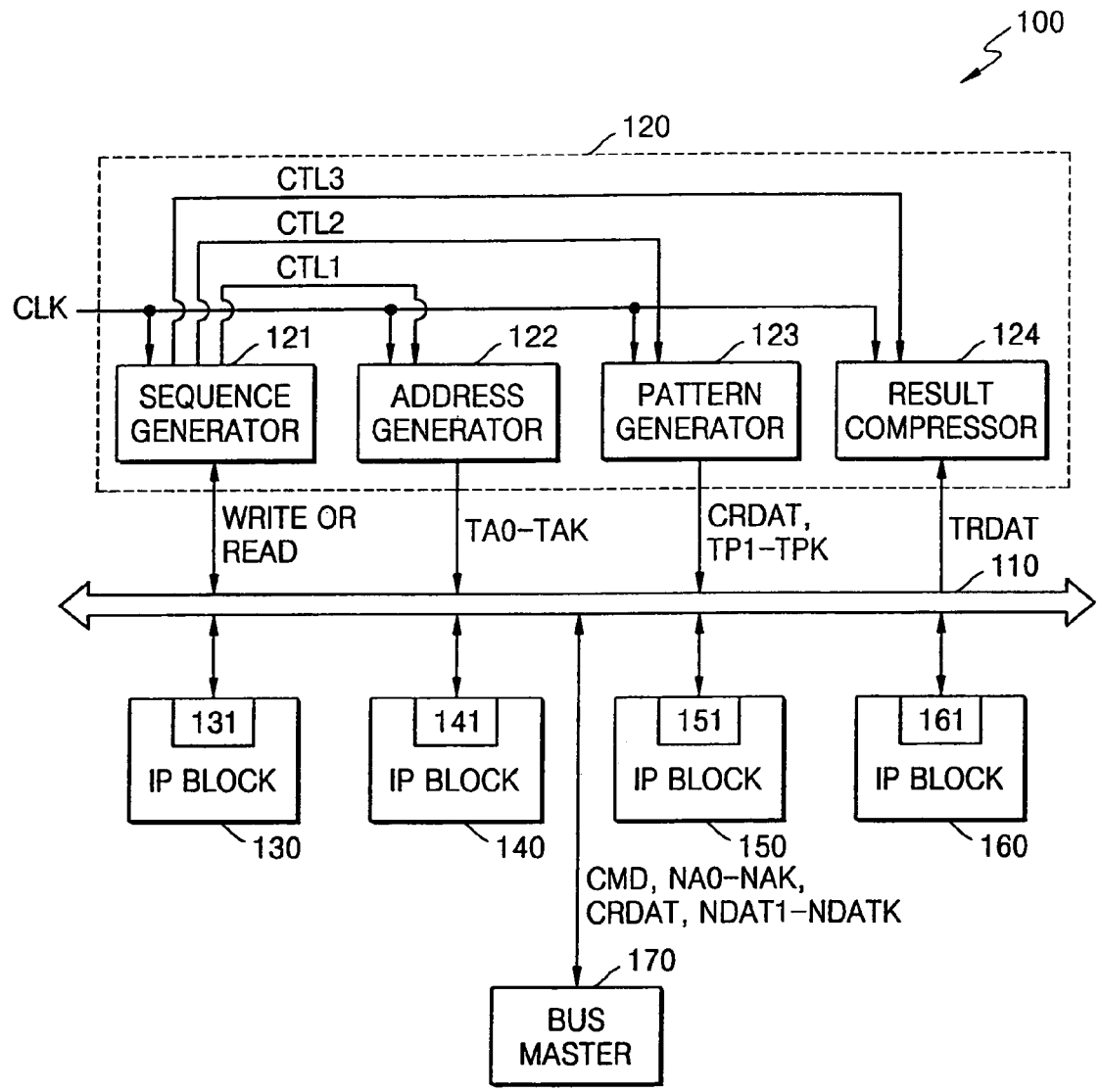
FIG. 3 is a block diagram of a SOC with a built-in-self-test circuit according to an exemplary embodiment of the present invention.

FIG. 3 is a block diagram of a system-on-chip (SOC) 100 with a built-in-self-test circuit according to an exemplary embodiment of the present invention. Referring to FIG. 3, the SOC 100 includes a built-in-self-test (BIST) control unit 120, intellectual property (IP) blocks 130 through 160, and a bus master 170.

The BIST control unit 120 and the IP blocks 130 through 160 are connected to a system bus 110, and communicate with each other through the system bus 110. The BIST control unit 120 includes a sequence generator 121, an address generator 122, a pattern generator 123, and a result compressor 124. A clock signal CLK is inputted to the sequence generator 121, the address generator 122, the pattern generator 123, and the result compressor 124. When the SOC 100 is in a test mode, the sequence generator 121 generates a write command signal WRITE or a read command signal READ and outputs the signal to the system bus 110. In addition, the sequence generator 121 generates sequence control signals CTL1 through CTL3, and outputs them to the address generator 122, the pattern generator 123, and the result compressor 124, respectively.

Figure 4:
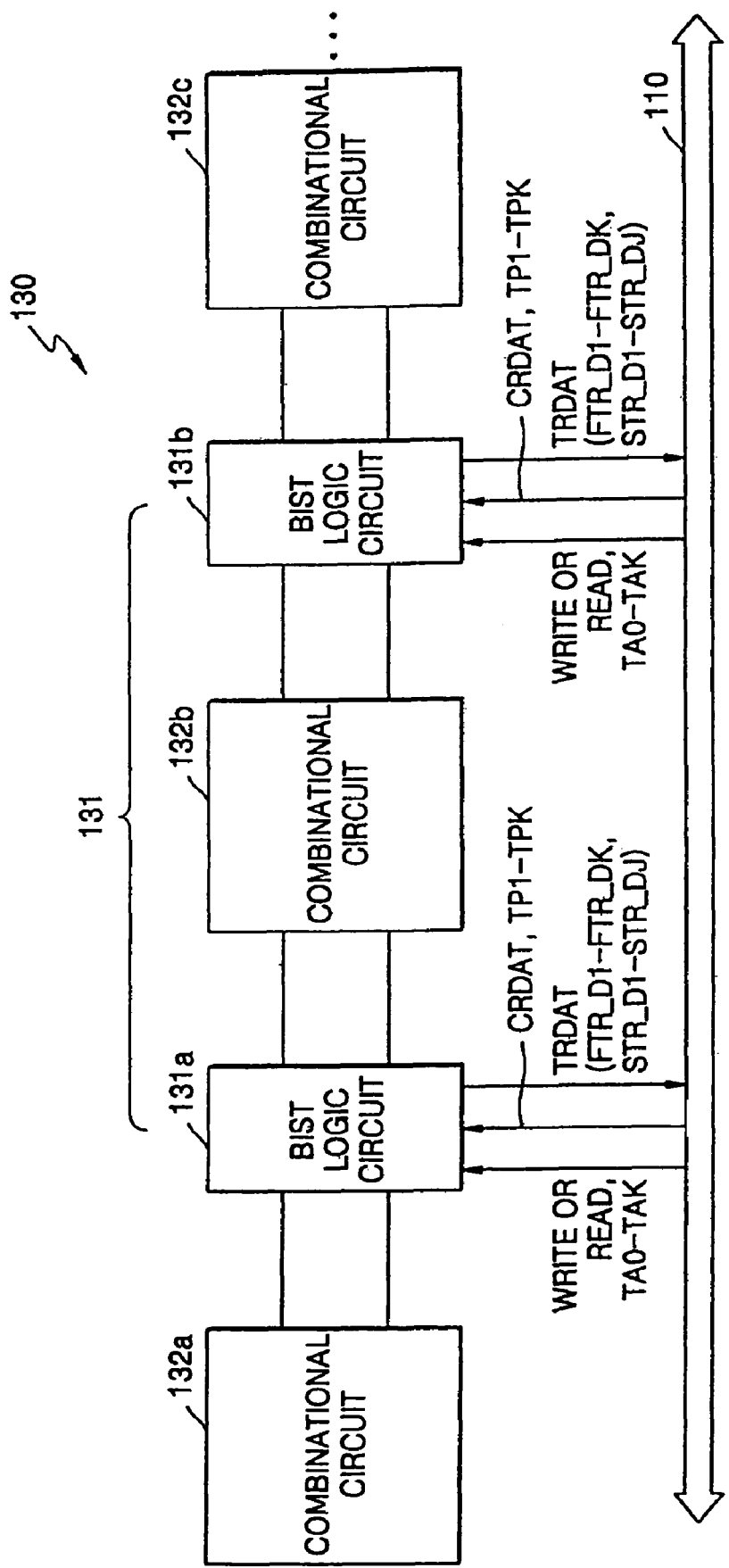
FIG. 4 is a view of an inner structure of an IP block included in the SOC of FIG. 3.

The address generator 122 generates test address signals TA0 through TAK (K is an integer), and outputs them to the system bus 110 in response to the sequence control signal CTL 1. The pattern generator 123 generates control data CRDAT and test pattern data TP1 through TPK (K is an integer), and outputs them to the system bus 110 in response to the sequence control signal CTL2. The result compressor 124 receives test result data TRDAT from the IP blocks 130 through 160 through the system bus 110 in response to the sequence control signal CTL3. The test result data TRDAT include first test result data FTR_D1 through FTR_DK as shown in FIG. 4 (K is an integer) and second test result data STR_D1 through STR_DJ as shown in FIG. 4 (J is an integer).

The result compressor 124 compresses and stores the received test result data TRDAT. Here, the compression result of the test result data TRDAT stored in the result compressor 124 may change according to whether or not the tested SOC 100 is defective. In other words, the compression result of the test result data TRDAT inputted to the result compressor 124 in the order of a set value is different from the compression result of the test result data TRDAT inputted to the result compressor 124 not in the order of a set value because of a defect in one of the IP blocks 130 through 160 or other components. Thus, whether a defect of the SOC 100 is detected or not in the testing process can be checked by comparing the final compression result of the test result data TRDAT stored in the result compressor 124 with the set value.

Also, although not shown in FIG. 3, a user can check for the possibility of a defective SOC 100 by reading the compressed and stored test result information in the result compressor 124 using an external control device. A detailed description of this technique is not included because this technique is well-known to those skilled in the related art.

The IP blocks 130 through 160 include BIST logic circuits 131 through 161, respectively. Although only the BIST logic circuits 131 through 161 are illustrated in FIG. 3, each of the IP blocks 130 through 160 includes a plurality of BIST logic circuits.

When the SOC 100 is in a normal mode, the bus master 170 outputs a command signal CMD, address signals NA0 through NAK (K is an integer), control data CRDAT, and normal data NDAT1 through NDATK (K is an integer) needed for the normal operation of the IP blocks 130 through 160.

FIG. 4 is a view of an inner structure of the IP block 130 included in the SOC 100 of FIG. 3. The inner structures and detailed operations of the IP blocks 140 through 160 are similar to the IP block 130. Thus, in an effort to avoid repletion, the self-test operation of the IP block 130 will be mainly described hereinafter.

Referring to FIG. 4, the IP block 130 includes BIST logic circuits 131a and 131b and combinational circuits 132a through 132c. Even though the IP block 130 includes additional BIST logic circuits and combinational circuits, the additional BIST logic circuits and combinational circuits are omitted from FIG. 4 to simplify the drawing. The BIST logic circuits 131a and 131b and the combinational circuits 132a through 132c are alternately disposed. The BIST logic circuits 131a and 131b are connected to the system bus 110. The BIST logic circuits 131a and 131b receive the write command signal WRITE or the read command signal READ, the test address signals TA0 through TAK, and the test pattern data TP1 through TPK through the system bus 110.

The BIST logic circuits 131a and 131b store the test pattern data TP1 through TPK, and output the stored test pattern data TP1 through TPK to the combinational circuits 132b and 132c, respectively, in response to the write command signal WRITE and the test address signals TA0 through TAK. In addition, the BIST logic circuits 131a and 131b output the test result data TRDAT received from the combinational circuits 132a and 132b to the system bus 110 in response to the read command signal READ and the test address signals TA0 through TAK.

The BIST logic circuits 131a and 131b operate not only in the test mode of the SOC 100 but also in the normal mode of the SOC 100. For example, in the normal mode of the SOC 100, the BIST logic circuit 131b transfers signals (not shown) related to the normal operation of the SOC 100, which are received from the combinational circuit 132b, to the combinational circuit 132c. In the test mode of the SOC 100, the BIST logic circuit 131b either transfers the test pattern data TP1 through TPK to the combinational circuit 132c or outputs the test result data TRDAT received from the combinational circuit 132b to the system bus 110.

Figure 5:
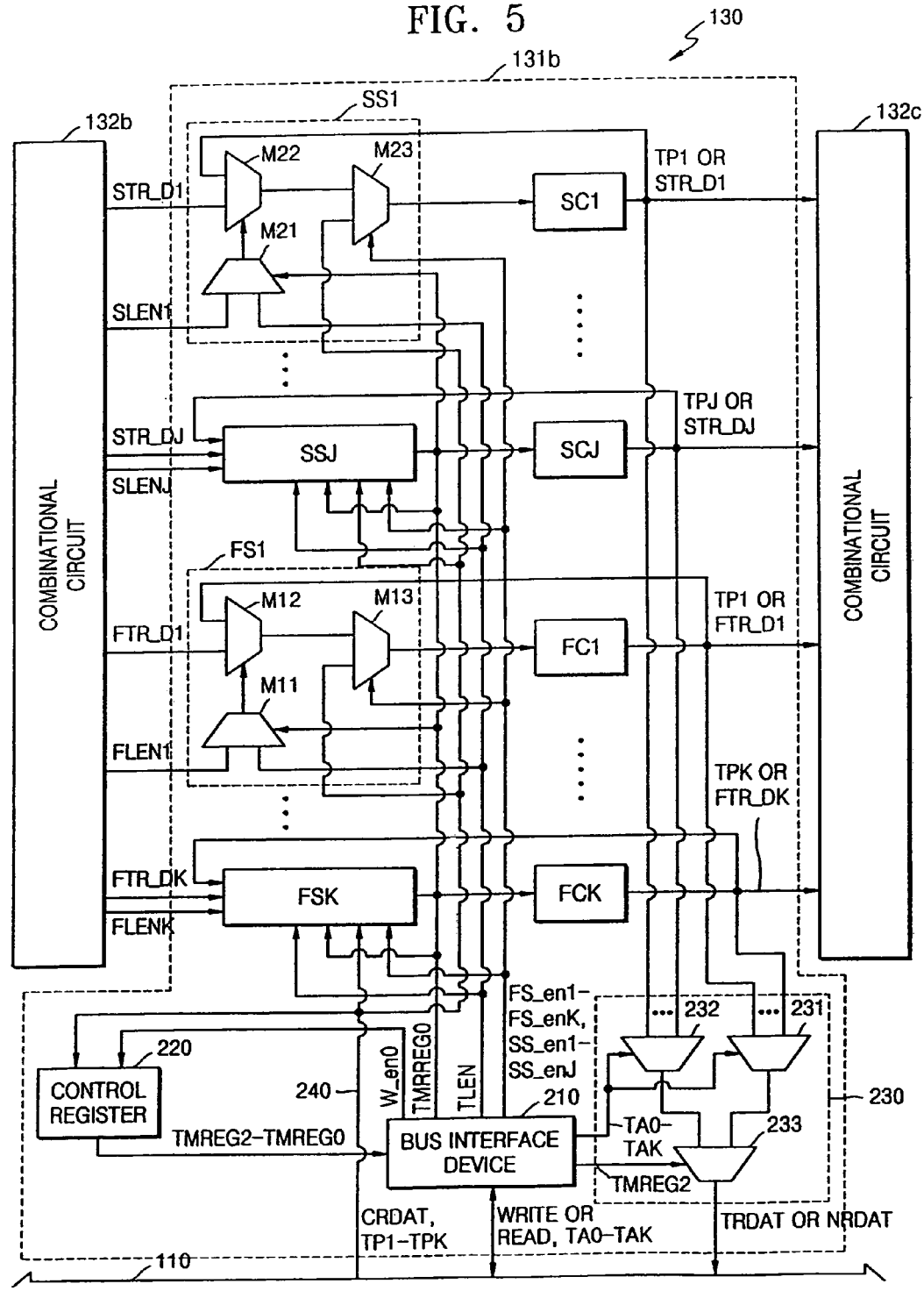
FIG. 5 is a view of a built-in-self-test (BIST) logic circuit and combinational circuits of FIG. 4.

FIG. 5 is a view of the BIST logic circuit 131b and the combinational circuits 132b and 132c of FIG. 4. The structure and detailed operation of the BIST logic circuit 131a is similar to that of the BIST logic circuit 131b. Referring to FIG. 5, the BIST logic circuit 131b includes a bus interface device 210, first selection circuits FS1 through FSK (K is an integer), first storage cells FC1 through FCK (K is an integer), second selection circuits SS1 through SSJ (J is an integer), second storage cells SC1 through SCJ (J is an integer), a control register 220, and an output selection circuit 230.

The bus interface device 210 and the output selection circuit 230 are connected to the system bus 110. The first selection circuits FS1 through FSK, the second selection circuits SS1 through SSJ, and the control register 220 are connected to the system bus 110 through a data path line 240.

In the test mode of the SOC 100, the bus interface device 210 receives the write command signal WRITE or the read command signal READ and the test address signals TA0 through TAK from the BIST control unit 120 through the system bus 110. The bus interface device 210 outputs a register control signal W_en0 to the control register 220 in response to the write command signal WRITE and the test address signal TA0.

Also, the bus interface device 210 receives test control signals TMREG2 through TMREG0, respectively, from the control register 220. The bus interface device 210 outputs the test control signal TMREG0 to the first and second selection circuits FS1 through FSK and SS1 through SSJ. The bus interface device 210 and the first and second selection circuits FS1 through FSK and SS1 through SSJ operate in the normal mode or the test mode in response to the test control signal TMREG0. That is, the bus interface device 210 and the first and second selection circuits FS1 through FSK and SS1 through SSJ operate in the normal mode when the test control signal TMREG0 is disabled, and operate in the test mode when the test control signal TMREG0 is enabled.

In the test mode, the bus interface device 210 outputs first selection control signals FS_en1 through FS_enK (K is an integer) and second selection control signals SS_en1 through SS_enJ (J is an integer) in response to the write command signal WRITE, the test address signals TA1 through TAK, and the test control signals TMREG2 and TMREG1. In more detail, when the test control signals TMREG2 and TMREG1 are disabled, the bus interface device 210 outputs the first selection control signals FS_en1 through FS-enK in response to the test address signals TA1 through TAK. The bus interface device 210 outputs the second selection control signals SS_en1 through SS_enJ in response to the test address signals TA1 through TAK when the test control signal TMREG1 is disabled and the test control signal TMREG2 is enabled. The bus interface device 210 outputs the second selection control signals SS_en1 through SS_enJ in response to the test address signals TA1 through TAK when the number of the second selection control signals SS_en1 through SS_enJ is less than the number of the test address signals TA1 through TAK.

Furthermore, the bus interface device 210 outputs a third selection control signal TLEN in response to the test control signal TMREG1. In more detail, the bus interface device 210 enables the third selection signal TLEN when the test control signal TMREG1 is enabled and disables the third selection signal TLEN when the test control signal TMREG1 is disabled. The bus interface device 120 outputs the test address signals TA0 through TAK to the output selection circuit 230. Also, the bus interface device 120 outputs the test control signal TMREG2 to the output selection circuit 230 in response to the read command signal READ.

The operation of the bus interface device 210 in the normal mode is the same as its operation in the test mode except for two differences. The first difference, as shown in FIG. 3, is that the bus interface device 210 receives the command signal CMD and the address signals NA0 through NAK from the bus master 170 instead of the BIST control unit 120. Thus, the bus interface device 210 generates the register control signal W_en0 and the first selection control signals FS_en1 through FS_enK in response to the command signal CMD and the address signals NA0 through NAK.

The second difference is that the bus interface device 210 does not generate the second control signals SS_en1 through SS_enJ. As a result, the second selection circuits SS1 through SSJ only perform an operation of outputting signals (not shown) related to the normal operation received from the combinational circuit 132b to the second storage cells SC1 through SCJ. That is, in the normal mode, the bus master 170 cannot write data to the second storage cells SC1 through SCJ or read data from the second storage cells SC1 through SCJ that are connected to the second selection circuits SS1 through SSJ through the system bus 110.

The first selection circuits FS1 through FSK are connected between the combinational circuit 132b and the first storage cells FC1 through FCK, and are further connected to the system bus 110 by the data pass line 240.

In the normal mode, i.e., when the test control signal TMREG0 is disabled, the first selection circuits FS1 through FSK operate in response to first normal selection signals FLEN1 through FLENK (K is an integer) and the first selection control signals FS_en1 through FS_enK. Here, the first normal selection signals FLEN1 through FLENK are generated by the combinational circuit 132b. The first selection circuits FS1 through FSK output signals (not shown) related to the normal operation received from the combinational circuit 132b or normal data NDAT1 through NDATK received from the data pass line 240 to the first storage cells FC1 through FCK. In more detail, the first selection circuits FS1 through FSK output the signals related to the normal operation to the first storage cells FC1 through FCK when the first normal selection signals FLEN1 through FLENK are enabled. Also, the first selection circuits FS1 through FSK output the normal data NDAT1 through NDATK to the first storage cells FC1 through FCK when the first normal selection signals FLEN1 through FLENK are disabled.

In the test mode, i.e., when the test control signal TMREG0 is enabled, the first selection circuits FS1 through FSK operate in response to the first selection control signals FS_en1 through FS_enK, the test control signal TMREG0, and the third selection control signal TLEN. The first selection circuits FS1 through FSK output the test pattern data TP1 through TPK received through the data pass line 240 to the first storage cells FC1 through FCK. Also, the first selection circuits FS1 through FSK output the first test result data FTR_D1 through FTR_DK received from the combinational circuit 132b to the first storage cells FC1 through FCK.

Each of the first selection circuits FS1 through FSK includes multiplexers M11 through M13. Because the structure and detailed operation of the first selection circuits FS1 through FSK are identical, the first selection circuit FS1 will be mainly discussed. The multiplexer M11 at the first selection circuit FS1 outputs one of the first normal selection signal FLEN1 and the third selection control signal TLEN to the multiplexer M12 in response to the test control signal TMREG0. In more detail, the multiplexer M11 outputs the first normal selection signal FLEN1 when the test control signal TMREG0 is disabled. Also, the multiplexer M11 outputs the third selection control signal TLEN when the test control signal TMREG0 is enabled. The multiplexer M12 outputs one of an output signal of the first storage cell FC1 and an output signal of the combinational circuit 132b in response to an output signal of the multiplexer M11. In more detail, the multiplexer M12 outputs the output signal of the first storage cell FC1 to the multiplexer M13 when the output signal of the multiplexer M11 is disabled. In addition, the multiplexer M12 outputs the output signal of the combinational circuit 132b to the multiplexer M13 when the output signal of the multiplexer M11 is enabled. The multiplexer M13 outputs one of the output signal of the multiplexer M12 and the test pattern data TP1 (or the normal data NDAT1) to the first storage cell FC1 in response to the first selection control signal FS_en1. In more detail, when the first selection control signal FS_en1 is disabled, the multiplexer M13 outputs the output signal of the multiplexer M12 to the first storage cell FC1. Also, when the first selection control signal FS_en1 is enabled, the multiplexer M13 outputs the test pattern data TP1 (or the normal data NDAT1) to the first storage cell FC1.

The second selection circuits SS1 through SSJ are connected between the combinational circuit 132b and the second storage cells SC1 through SCJ, and are further connected to the system bus 110 by the data pass line 240.

In the normal mode, the second selection circuits SS1 through SSJ output the signals related to normal operations received from the combinational circuit 132b to the second storage cells SC1 through SCJ in response to second normal selection signals SLEN1 through SLENJ. Here, the second normal selection signals SLEN1 through SLENJ are generated by the combinational circuit 132b.

In the test mode, the second selection circuits SS1 through SSJ operate in response to the second selection control signals SS_en1 through SS_enJ, the test control signal TMREG0, and the third selection control signal TLEN. The second selection circuits SS1 through SSJ output the test pattern data TP1 through TPJ received through the data pass line 240 to the second storage cells SC1 through SCJ. Also, the second selection circuits SS1 through SSJ output the second test result data STR_D1 through STR_DJ received from the combinational circuit 132b to the second storage cells SC1 through SCJ.

Each of the second selection circuits SS1 through SSJ includes multiplexers M21 through M23. Because the structure and detailed operation of the second selection circuits SS1 through SSJ are identical, the second selection circuit SS1 will be mainly discussed. The multiplexer M21 at the second selection circuit SS1 outputs one of the second normal selection signal SLEN1 and the third selection control signal TLEN to the multiplexer M22 in response to the test control signal TMREG0. In more detail, the multiplexer M21 outputs the second normal selection signal SLEN1 when the test control signal TMREG0 is disabled. Also, the multiplexer M21 outputs the third selection control signal TLEN when the test control signal TMREG0 is enabled. The multiplexer M22 outputs one of an output signal of the second storage cell SC1 and an output signal of the combinational circuit 132b in response to an output signal of the multiplexer M21. In more detail, the multiplexer M22 outputs the output signal of the second storage cell SC1 to the multiplexer M23 when the output signal of the multiplexer M21 is disabled. In addition, the multiplexer M22 outputs the output signal of the combinational circuit 132b to the multiplexer M23 when the output signal of the multiplexer M21 is enabled. The multiplexer M23 outputs one of the output signal of the multiplexer M22 and the test pattern data TP1 (or the normal data NDAT1) to the second storage cell SC1 in response to the second selection control signal SS_en1. In more detail, when the second selection control signal SS_en1 is disabled, the multiplexer M23 outputs the output signal of the multiplexer M22 to the second storage cell SC1. Also, when the second selection control signal SS_en1 is enabled, the multiplexer M23 outputs the test pattern data TP1 (or the normal data NDAT1) to the second storage cell SC1.

The first storage cells FC1 through FCK store the output of the first selection circuits FS1 through FSK, and output the stored signals to the combinational circuit 132c. The second storage cells SC1 through SCK also store the output signals of the second selection circuits SS1 through SSJ, and output the stored signals to the combinational circuit 132c.

The control register 220 stores the control data CRDAT received through the data pass line 240 in response to the register control signal W_en0, and outputs the test control signals TMREG2 through TMREG0 based on a bit value of the stored control data CRDAT. In more detail, it is presumed that the highest bit of the control data CRDAT is bit-2, the middle bit is bit-1, and the lowest bit is bit-0. The control register 220 enables or disables the test control signal TMREG2 according to a value of bit-2. For example, the control register 220 enables the test control signal TMREG2 when a value of bit-2 is "1," and disables the test control signal TMREG2 when a value of bit-2 is "0." Similarly, the control register 220 enables or disables each of the test control signals TMREG1 and TMREG0 according to values of bit-1 and bit-0.

In the normal mode, the output selection circuit 230 operates in response to the test control signal TMREG2 received from the bus interface device 210 and the normal address signals NA0 through NAK. The output selection circuit 230 sequentially selects signals related to the normal operation received from the first storage cells FC1 through FCK and outputs them to the system bus 110 as normal data NRDAT. In the test mode, the output selection circuit 230 receives the first and second test result data FRT_D1 through FTR_DK and STR_D1 through STR_DJ from the first and second storage cells FC1 through FCK and SC1 through SCJ. The output selection circuit 230 outputs the test result data TRDAT to the system bus 110 in response to the test control signal TMREG2 and the test address signals TA0 through TAK received from the bus interface device 210. Here, the test result data TRDAT include the first and second test result data FTR_D1 through FTR_DK and STR_D1 through STR_DJ.

The output selection circuit 230 includes multiplexers 231 through 233. The multiplexer 231 sequentially selects output signals of the first storage cells FC1 through FCK and outputs them in response to the test address signals TA0 through TAK (or the normal address signals NA0 through NAK). The multiplexer 232 sequentially selects output signals of the second storage cells SC1 through SCJ and outputs them in response to the test address signals TA0 through TAK (or the normal address signals NA0 through NAK). The multiplexer 233 outputs one of the output signals of the multiplexers 231 and 232 as the test result data TRDAT (or the normal data NRDAT) in response to the test control signal TMREG2. In more detail, when the test control signal TMREG2 is disabled, the multiplexer 233 outputs the output signal of the multiplexer 231 to the system bus 110 as the test result data TRDAT (or the normal data NRDAT). Also, when the test control signal TMREG2 is enabled, the multiplexer 233 outputs the output signal of the multiplexer 232 to the system bus 110 as the test result data TRDAT (or the normal data NRDAT).

Figure 6:
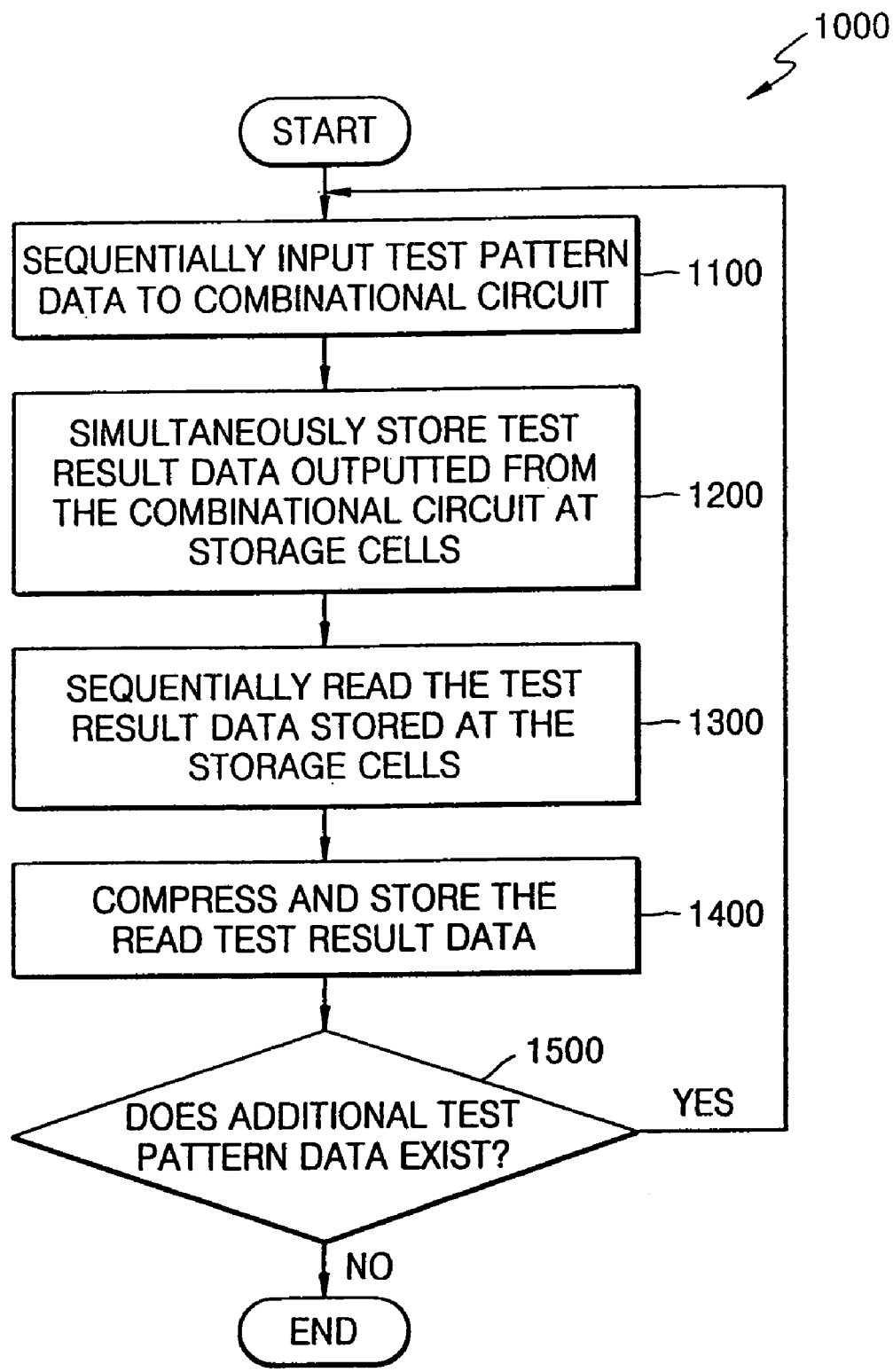
FIG. 6 is a flowchart of a self-test process of the SOC according to an exemplary embodiment of the present invention.

Next, a self-test operation process of the SOC 100 with above-mentioned structure will be described. Here, the description of the self-test operation process of the SOC 100 will center on a self-test process of the IP block 130. FIG. 6 is a flowchart of the self-test process of the SOC 100 according to an exemplary embodiment of the present invention. Referring to FIG. 6, the BIST control unit 120 sequentially inputs the test pattern data TP1 through TPK and TP1 through TPJ to the combinational circuit 132c through the BIST logic circuit 131 of the IP block 130 (Step 1100). Step 1100 will be described in more detail with reference to FIG. 7 later. The BIST control unit 120 simultaneously stores the first and second test result data FTR_D1 through FTR_DK and STR_D1 through STR_DJ outputted from the combinational circuit 132b in the first and second storage cells FC1 through FCK and SC1 through SCJ by controlling the BIST logic circuit 131 (Step 1200). Here, the test pattern data TP1 through TPK and TP1 through TPJ are already inputted to the combinational circuit 132b by the BIST logic circuit 131a as shown, for example, in FIG. 4. Thus, the combinational circuit 132b outputs the first and second test result data FTR_D1 through FTR_DK and STR_D1 through STR_DJ in response to the test pattern data TP1 through TPK and TP1 through TPJ.

Afterwards, the BIST control unit 120 sequentially reads the first and second test result data FTR_D1 through FTR_DK and STR_D1 through STR_DJ stored in the first and second storage cells FC1 through FCK and SC1 through SCJ (Step 1300). The Step 1300 will be described in more detail with reference to FIG. 8 later. The result compressor 124 of the BIST control unit 120 compresses and stores the read first and second test result data FTR_D1 through FTR_DK and STR_D1 through STR_DJ (Step 1400). Then, the sequence generator 121 of the BIST control unit 120 determines whether an additional test pattern data exists or not (Step 1500). Here, the BIST control unit 120 can test the IP block 130 several times depending on the type of test. Thus, for example, one type of test for the IP block 130 is finished when Steps 1100 through 1400 are performed once. The BIST control unit 120 determines that another type of test exists when additional test pattern data exists at Step 1500.

When additional test pattern data exists at Step 1500, the self-test process is returned to Step 1100. Then, the above-described process is repeated until the pattern generator 123 generates all test pattern data and sends it to test the IP block 130, i.e., when all types of tests for the IP block 130 are finished. Also, when additional test pattern data does not exist in Step 1500, the routine 1000 is terminated.

Figure 7:
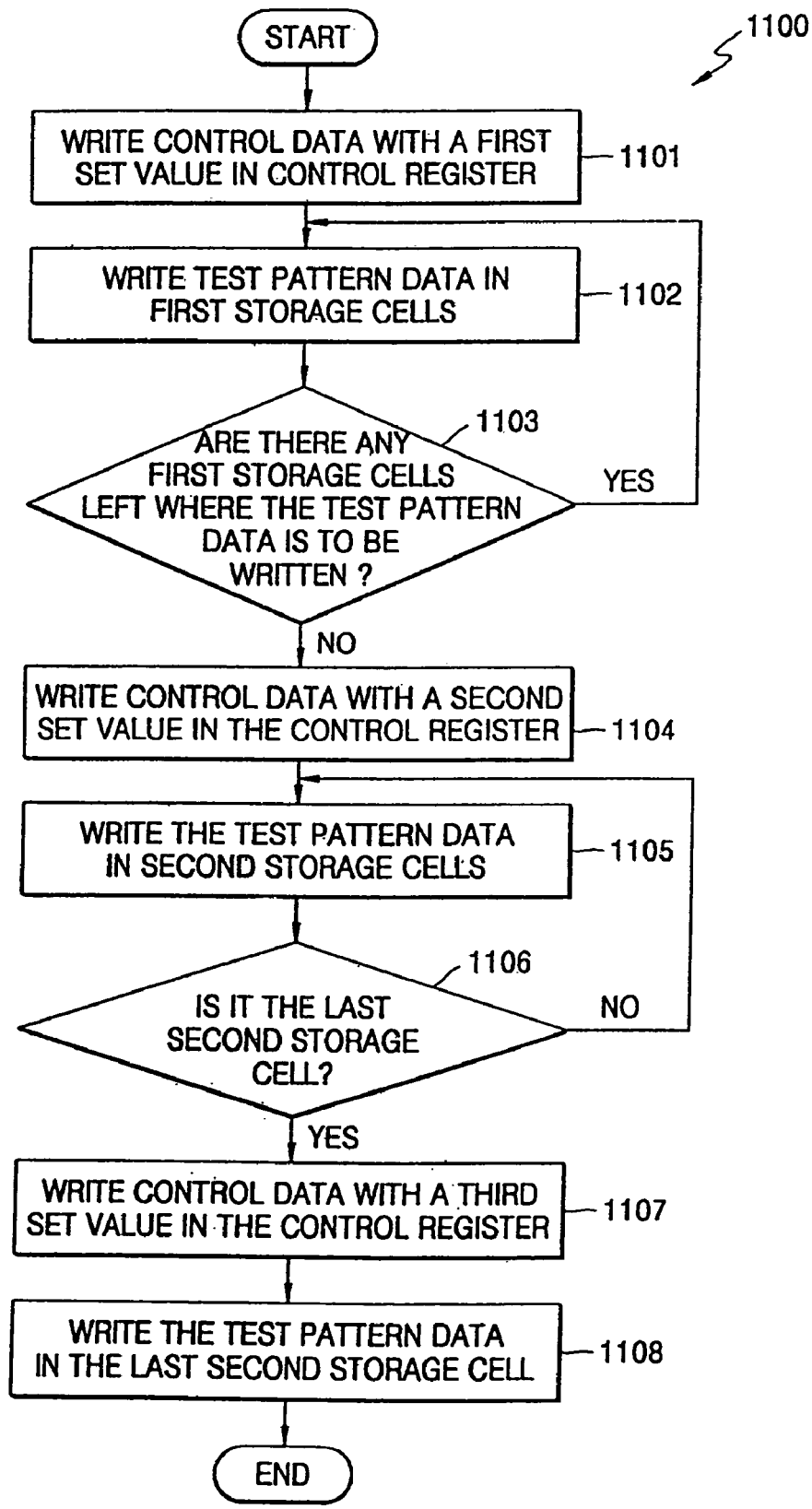
FIG. 7 is a flowchart of a sub-routine 1100 of FIG. 6.
Figure 9:
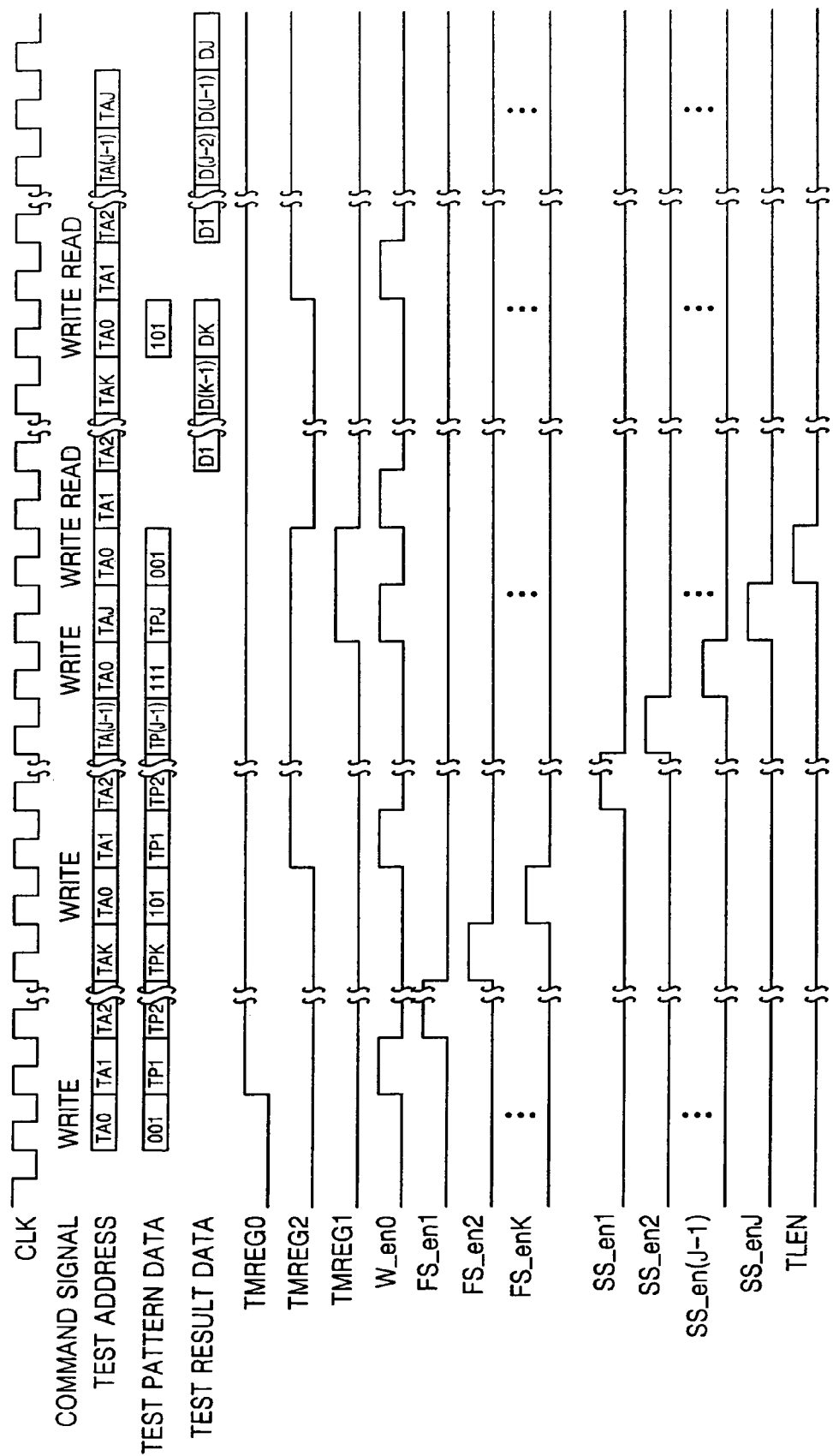
FIG. 9 is a timing diagram of signals generated during the self-test process at the BIST logic circuit of FIG. 5.

Next, referring to FIGS. 7 and 9, Step 1100 will be described in more detail. FIG. 7 is a flowchart of the sub-routine 1100 of FIG. 6, and FIG. 9 is a timing diagram of signals generated during the self-test process of the BIST logic circuit 131b of FIG. 5. Referring to FIG. 7, the BIST control unit 120 writes the control data CRDAT with a first set value in the control register 220 of the BIST logic circuit 131b (Step 1101).

In more detail, the sequence generator 121 outputs the write command signal WRITE to the system bus 110 and generates the sequence control signals CTL1 and CTL2 by synchronizing with the clock signal CLK. The address generator 122 generates the test address signals TA0 through TAK and outputs them to the system bus 110 in response to the clock signal CLK and the sequence control signal CTL1. The pattern generator 123 generates the control data CRDAT and the test pattern data TP1 through TPK and outputs them to the system bus 110 in response to the clock signal CLK and the sequence control signal CTL2. The bus interface device 210 of the BIST logic circuit 131b enables the register control signal W_en0 in response to the write command signal WRITE and the test address signal TA0. The control register 220 stores the control data CRDAT in response to the register control signal W_en0. Here, the control data CRDAT has a bit value of "001" as shown in FIG. 9. The control register 220 outputs the test control signals TMREG2 through TMREG0 based on a bit value of the control data CRDAT. That is, the control register 220 disables the test control signals TMREG 2 and TMREG 1, and enables the test control signal TMREG0.

Afterwards, the bus interface device 210 generates the first selection control signals FS_en1 through FS_enK in response to the write command signal WRITE, the test control signals TMREG2 and TMREG1, and the test address signals TA1 through TAK. Here, the bus interface device 210 sequentially enables and outputs the first selection control signals FS_en1 through FS_enK. In response to the first selection control signals FS_en1 through FS_enK, the multiplexer M13 of the first selection circuits FS1 through FSK sequentially selects and outputs the test pattern data TP1 through TPK. As a result, the test pattern data TP1 through TPK are sequentially written in the first storage cells FC1 through FCK (Step 1102).

Next, it is determined whether any of the first storage cells FC1 through FCK are left where the test pattern data TP1 through TPK can be written in (Step 1103). The sub-routine 1100 returns to Step 1102 when it is determined which of the first storage cells FC1 through FCK where the test pattern data TP1 through TPK is to be written are left in Step 1103. In addition, when the test pattern data TP1 through TPK are written in all the first storage cells FC1 through FCK in Step 1103, control data CRDAT with a second set value are written in the control register 220 (Step 1104). Here, the process of writing the control data CRDAT with the second set value in the control register 220 is the same as the process of writing the control data CRDAT with the first set value in the control register 220. Here, the control data CRDAT has a bit value of "101" as shown in FIG. 9. The control register 220 enables the test control signals TMREG2 and TMREG0, and disables and outputs the test control signal TMREG1 based on the bit value of the control data CRDAT. While Step 1104 is being performed, the sequence generator 121 outputs the write command signal WRITE to the system bus 110, and generates the sequence control signals CTL1 and CTL2. The address generator 122 generates the test address signals TA1 through TAK and outputs them to the system bus 110 in response to the clock signal CLK and the sequence control signal CTL1. The pattern generator 123 generates the test pattern data TP1 through TPK and outputs them to the system bus 110 in response to the clock signal CLK and the sequence control signal CTL2.

Because the test control signal TMREG2 is enabled, the bus interface device 210 generates the second selection control signals SS_en1 through SS_en(J–1) in response to the test address signals TA1 through TA(J–1). Here, the bus interface device 210 sequentially enables and outputs the second selection control signals SS_en1 through SS_en(J–1). In response to the second selection control signals SS_en1 through SS_en(J–1), the multiplexer M23 of the second selection circuits SS1 through SS(J–1) sequentially selects and outputs the test pattern data TP1 through TP(J–1). Consequently, the test pattern data TP1 through TP(J–1) are sequentially written in the second storage cells SC1 through SC(J–1) (Step 1105).

Here, the sequence generator 121 determines whether the next step is for the test pattern data TPJ to be written in the second storage cell SCJ in response to the clock signal CLK (Step 1106). When it is time for the test pattern data TPJ to be written in the second storage cell SCJ in Step 1106, the BIST control unit 120 writes the control data CRDAT with a third set value into the control register 220 (Step 1107). Here, the process of the control data CRDAT with the third set value being written in the control register 220 is the same as the process of the control data CRDAT with the first set value being written in the control register 220. Here, the control data CRDAT has a bit value of "111" as shown in FIG. 9. The control register 220 enables and outputs all the test control signals TMREG2 through TMREG0 based on the bit value of the control data CRDAT. Next, the bus interface device 210 enables and outputs the second selection control signal SS_enJ in response to the test address signal TAJ.

In response to the second selection control signal SS_enJ, the multiplexer M23 of the second selection circuit SSJ selects and outputs the test pattern data TPJ. As a result, the test pattern data TPJ is written in the second storage cell SCJ (Step 1108). Afterwards, the sub-routine 1100 is terminated. Meanwhile, as the Step 1108 is being performed, the bus interface device 210 enables the third selection control signal TLEN for a predetermined time, as shown in FIG. 9, and then disables it because the test control signal TMREG1 is enabled. Here, each multiplexer M11 of the first selection circuits FS1 through FSK and each multiplexer M21 of the second selection circuits SS1 through SSJ selects and outputs the third selection control signal because the test control signal TMREG0 is enabled. Consequently, the multiplexers M12s of the first selection circuits FS1 through FSK output the first test result data FTR_D1 through FTR_DK received from the combinational circuit 132b in response to the third selection control signal TLEN. Also, the multiplexers M22s of the second selection circuits SS1 through SSJ output the second test result data STR_D1 through STR_DJ received from the combinational circuit 132b in response to the third selection control signal TLEN.

Figure 8:
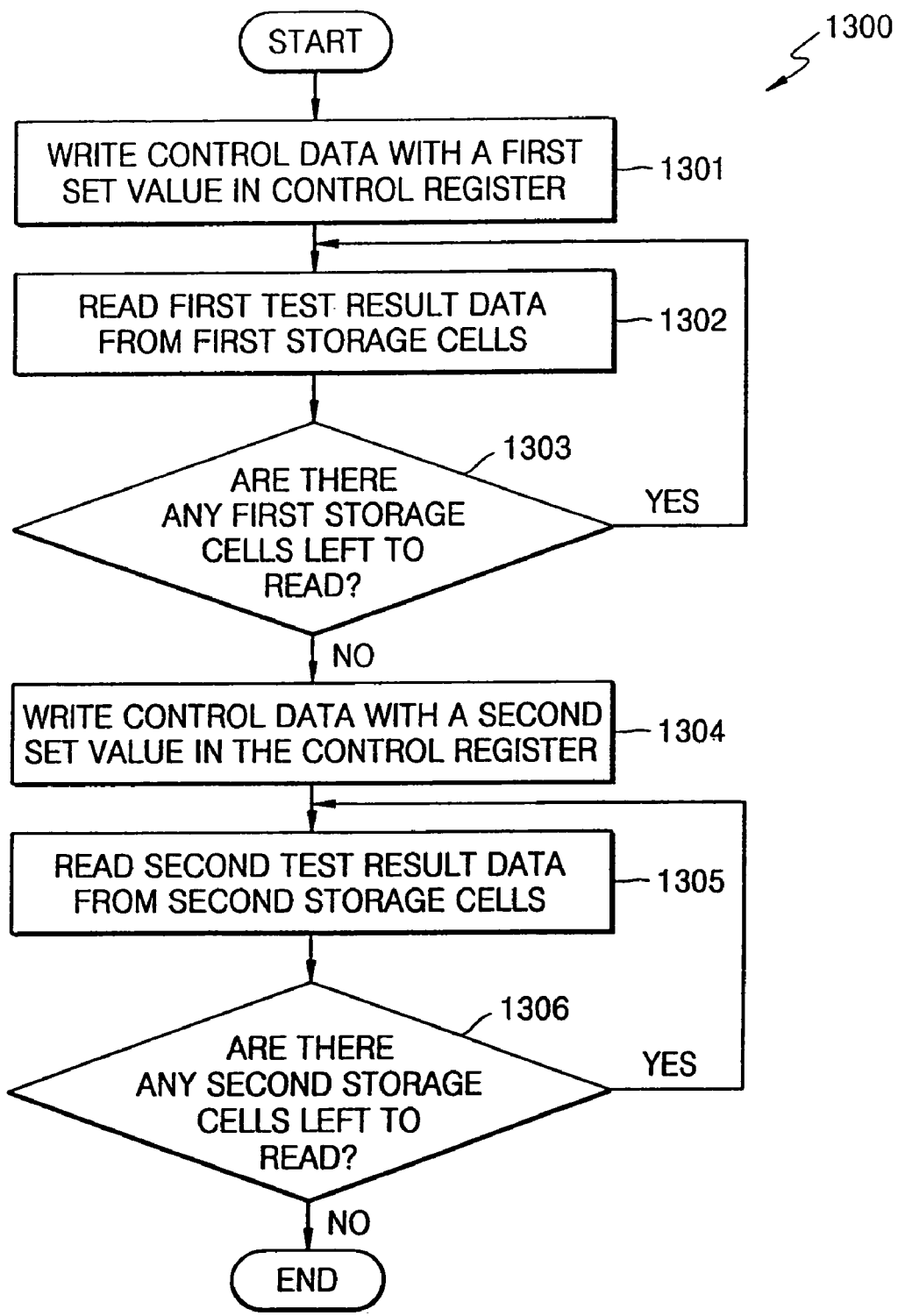
FIG. 8 is a flowchart of a sub-routine 1300 of FIG. 6.

FIG. 8 is a flowchart of the sub-routine 1300 of FIG. 6. Referring to FIG. 8, the BIST control unit 120 writes the control data CRDAT with the first set value in the control register 220 of the BIST logic circuit 131b (Step 1301). Here, the process of the control data CRDAT with the first set value being written in the control register 220 is the same as described above with reference to FIG. 7. Here, the control data CRDAT has a bit value of "001," as shown in FIG. 9. The control register 220 disables the test control signals TMREG2 and TMREG1, and enables and outputs the test control signal TMREG0 based on the bit value of the control data CRDAT.

After Step 1301 is performed, the BIST control unit 120 reads the first test result data FTR_D1 through FTR_DK from the first storage cells FC1 through FCK of the BIST logic circuit 131b (Step 1302). In more detail, the sequence generator 121 outputs the read command signal READ to the system bus 110, and generates the sequence control signal CTL1 by synchronizing it with the clock signal CLK. The address generator 122 generates the test address signals TA1 through TAK and outputs them to the system bus 110 in response to the clock signal CLK and the sequence control signal CTL1. The bus interface device 210 disables all the first and second selection control signals FS_en1 through FS_enK and SS_en1 through SS_enJ in response to the read command signal READ. The multiplexers M13s of the first selection circuits FS1 through FSK select the output signals of the multiplexers M12s and output them to each of the first storage cells FC1 through FCK in response to the first selection control signals FS_en1 through FS_enK. Here, the first test result data FTR_D1 through FTR_DK are simultaneously inputted to the first storage cells FC1 through FCK because the multiplexers M12s are in a state of outputting the first test result data FTR_D1 through FTR_DK. The first storage cells FC1 through FCK store the first test result data FTR_D1 through FTR_DK, and output each of the stored first test result data FTR_D1 through FTR_DK.

Also, the multiplexers M23s of the second selection circuits SS1 through SSJ select the output signal of the multiplexers M22s and output them to each of the second storage cells SC1 through SCJ in response to the second selection control signals SS_en1 through SS_enJ. Here, the second test result data STR_D1 through STR_DJ are simultaneously inputted to the second storage cells SC1 through SCJ because the multiplexers M22s are in a state of outputting the second test result data STR_D1 through STR_DJ. The second storage cells SC1 through SCJ store the second test result data STR_D1 through STR_DJ, and output each of the stored second test result data STR_D1 through STR_DJ.

Here, the bus interface device 210 outputs the test address signals TA1 through TAK and the test control signal TMREG2 to the output selection circuit 230 in response to the read command signal READ. In response to the test address signals TA1 through TAK, the multiplexer 231 of the output selection circuit 230 sequentially selects and outputs the first test result data FTR_D1 through FTR_DK received from the first storage cells FC1 through FCK. Because the test control signal TMREG2 is disabled, the multiplexer 233 of the output selection circuit 230 outputs the first test result data FTR_D1 through FTR_DK sequentially received from the multiplexer 231 to the system bus 110 as the test result data TRDAT.

Afterwards, the BIST control unit 120 determines whether there are any first storage cells left to read in response to the clock signal CLK (Step 1303). When there are first storage cells left to read in Step 1303, the sub-routine 1300 returns to Step 1302. Also, when there are not any first storage cells left to read in Step 1303, the BIST control unit 120 writes control data CRDAT with the second set value in the control register 220 of the BIST logic circuit 131b (Step 1304). Here, the process of the control data CRDAT with the second set value being written in the control register 220 is the same as described above with reference to FIG. 7. The control data CRDAT has a bit value of "101" as shown in FIG. 9. The control register 220 enables the test control signals TMREG2 and the TMREG0, and disables and outputs the test control signal TMREG1 based on the bit value of the control data CRDAT.

After performing Step 1304, the BIST control unit 120 reads the second test result data STR_D1 through STR_DJ from the second storage cells SC1 through SCJ of the BIST logic circuit 131b (Step 1305). In more detail, the sequence generator 121 outputs the read command signal READ to the system bus 110, and generates the sequence control signal CTL1 by synchronizing with the clock signal CLK. The address generator 122 generates the test address signals TA1 through TAK and outputs them to the system bus 110 in response to the clock signal CLK and the sequence control signal CTL1. The bus interface device 210 outputs the test address signals TA1 through TAK and the test control signal TMREG2 to the output selection circuit 230 in response to the read command signal READ. The multiplexer 232 of the output selection circuit 230 sequentially selects and outputs the second test result data STR_D1 through STR_DJ received from the second storage sells SC1 through SCJ in response to the test address signals TA1 through TAK. Because the test control signal TMREG2 is enabled, the multiplexer 233 outputs the second test result data STR_D1 through STR_DJ received in a sequence from the multiplexer 232 to the system bus 110 as the test result data TRDAT.

Then, the BIST control unit 120 determines whether there are any second storage cells left to read in response to the clock signal CLK (Step 1306). When there are second storage cells left to read in Step 1306, the sub-routine 1300 returns to Step 1305. Also, when there are not any second storage cells left to read in Step 1306, the sub-routine 1300 is terminated.

As described above, a SOC with built-in-self-test circuits according to an exemplary embodiment of the present invention and a self-test method of the SOC can perform a test at an operation speed of the SOC because a signal pass in a normal mode is also used in a test mode, thus enabling the test time to be shortened. Also, the SOC with built-in-self-test circuits according to an exemplary embodiment of the present invention and the self-test method of the SOC can perform the test after the SOC is installed on a circuit board because the test is carried out with a system bus as a basis which is similar to that in the normal mode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A self-test method of a system-on-chip (SOC) with a built-in-self-test (BIST) circuit, the method comprising:
   inputting test pattern data to a first combinational circuit through a BIST logic circuit;
   storing test result data outputted from a second combinational circuit in storage cells within the BIST logic circuit;
   reading the test result data stored in the storage cells; and
   compressing and storing the read test result data;

wherein each of the storage cells comprises:

first storage cells and second storage cells; wherein the step of inputting test pattern data includes:

writing control data with a first set value in a control register within the BIST logic circuit;

writing the test pattern data in the first storage cells;

writing the control data with a second set value in the control register;

writing the test pattern data in the second storage cells; and writing the control data with a third set value in the control register when the test pattern data is written in the last second storage cell among the second storage cells.

2. The method of claim 1, wherein the BIST logic circuit, and the first and second combinational circuits are included within one intellectual property (IP) block.

3. The method of claim 1, further comprising:

repeating the steps of inputting test pattern data through compressing and storing of the read test result data when additional test pattern data exist after the compressing and storing the read test result data.

4. The method of claim 1, wherein each of the storage cells comprises:

first storage cells and second storage cells, and the test result data comprises first test result data and second test result data; wherein the step of reading the test result data includes:

writing control data with a first set value in a control register within the BIST logic circuit;

reading the first test result data from the first storage cells;

writing the control data with a second set value in the control register; and reading the second test result data from the second storage cells.

* * * * *